(12) United States Patent
Yang et al.

(10) Patent No.: US 7,985,626 B2
(45) Date of Patent: Jul. 26, 2011

(54) MANUFACTURING TOOL FOR WAFER LEVEL PACKAGE AND METHOD OF PLACING DIES

(75) Inventors: Wen-Kun Yang, Hsinchu (TW); Wen-Pin Yang, Hsinchu (TW); Shih-li Chen, Jhudong Township (TW)

(73) Assignee: Advanced Chip Engineering Technology Inc., Hukou Township (TW)

( * ) Notice: Subject to any disclaimer, the term of this patent is extended or adjusted under 35 U.S.C. 154(b) by 11 days.

(21) Appl. No.: 11/158,167

(22) Filed: Jun. 20, 2005

(65) Prior Publication Data

US 2005/0247398 A1     Nov. 10, 2005

Related U.S. Application Data

(62) Division of application No. 10/842,959, filed on May 10, 2004, now abandoned.

(51) Int. Cl.
*H01L 21/44* (2006.01)
(52) U.S. Cl. .................. 438/118; 438/458; 438/464
(58) Field of Classification Search ............ 438/113, 438/114, 118, 119, 455, 458, 459, 464, 465
See application file for complete search history.

(56) References Cited

U.S. PATENT DOCUMENTS

| | | | | |
|---|---|---|---|---|
| 5,366,573 A | * | 11/1994 | Bayer et al. | ................... 156/64 |
| 5,383,997 A | * | 1/1995 | Minowa et al. | ............... 156/235 |
| 6,297,076 B1 | | 10/2001 | Amagai et al. | |
| 6,772,510 B1 | | 8/2004 | Corisis | |
| 6,780,733 B2 | | 8/2004 | Chason et al. | |
| 6,852,608 B2 | | 2/2005 | Kitamura et al. | |
| 2002/0055238 A1 | | 5/2002 | Sugino et al. | |
| 2003/0134490 A1 | | 7/2003 | Inuzuka | |
| 2004/0020036 A1 | * | 2/2004 | Arneson et al. | ................. 29/825 |
| 2004/0121514 A1 | | 6/2004 | Yoo et al. | |
| 2006/0030120 A1 | | 2/2006 | Shao et al. | |

FOREIGN PATENT DOCUMENTS

| | | | |
|---|---|---|---|
| JP | 3-181147 | | 8/1991 |
| JP | 03-212940 | * | 9/1991 |
| JP | 8-107088 | | 4/1996 |

* cited by examiner

*Primary Examiner* — Kevin M Picardat
(74) *Attorney, Agent, or Firm* — Perkins Coie LLP

(57) ABSTRACT

A manufacturing method of placing dice for a wafer level package comprises placing a plurality of dice on an elastic material, which is formed on a first base, and the elastic material of the present invention has viscosity in a first condition to adhere the plurality of dice; forming an adhesive material on a second base; adhering the plurality of dice on the adhesive material of the second base; and stripping the plurality of dice from the elastic material in a second condition.

9 Claims, 7 Drawing Sheets

US 7,985,626 B2

MANUFACTURING TOOL FOR WAFER LEVEL PACKAGE AND METHOD OF PLACING DIES

CROSS-REFERENCE TO RELATED APPLICATIONS

This application is a divisional of U.S. patent application Ser. No. 10/842,959, filed May 10, 2004, which is hereby incorporated by reference in its entirety.

TECHNICAL FIELD

This invention relates to a manufacturing tool for wafer level package, and more particularly to a die placing tool for wafer level package and placing method of the same by selecting good dies from the processed wafer, thereafter placing the good die on the tool by using a pick and place system.

BACKGROUND

In conventional semiconductor device fabrication processes, a number of distinct semiconductor devices, such as memory chips or microprocessors, are fabricated on a semiconductor substrate, such as a silicon wafer. After the desired structures, circuitry, and other features of each of the semiconductor devices have been fabricated upon the semiconductor substrate, the substrate is typically singulated to separate the individual semiconductor devices from one another.

Various post-fabricating processes, such as testing the circuits of each of the semiconductor devices and burn-in processes, may be employed either prior to or following singulation of the semiconductor substrate. These post-fabricating processes may be employed to impart the semiconductor devices with their intended functionality and to determine whether or not each of the individual semiconductor devices meets quality control specifications.

The individual semiconductor devices may then be packaged. Along with the trend in the semiconductor industry to decrease semiconductor device size and increase the density of structures of semiconductor devices, package sizes are also ever-decreasing. One type of semiconductor device package, the so-called "chip-scale package" or "chip-sized package" ("CSP"), consumes about the same amount of real estate upon a substrate as the bare semiconductor device itself. Such chip-scale packages typically include a carrier substrate having approximately the same surface area as the semiconductor device.

Presently, any type package technique of IC device is adopted firstly sawing the die on wafer to be individual die, and then packaging and testing of the sawed dies. Such package technique of sawing prior to packaging and testing causes a tedious and complicated process and increasing cost of packaging and testing of the. IC device, owing to continuously repeating packaging and testing of the sawed die.

Moreover, a new type wafer level package "process of fan out wafer level package" (filed by Taiwan Patent Number 177,766) discloses that the sawed die need be placed on a glass substrate after sawing. In convention, the sawed dice are adopted one by one placing to the glass substrate. The above-mentioned step needs continuously repeating a pick and place action. The action by using labor power or machine may cause a burden on time, cost and yield for a packaging and testing factory.

Therefore, the present provides a new tool of wafer level package to improve die placing efficiency of wafer level package and decrease time and cost.

SUMMARY

The main objective of the present invention is to provide a tool of wafer level package and placing method of dies. The good dies are selected from the processed wafer and place the good dies on a tool by using a pick and place system. The placing method of dies of the present invention can improve placing efficiency and yield of the dies of wafer level package.

A tool for wafer level package, comprising a first base; an elastic material on the first base, the elastic material having viscosity in a first condition to adhere a die; and a second base having adhesive material to adhere the die, the die could be departed from the elastic material in a second condition. Wherein material of the first base is silicon, glass, quartz or ceramic. The material of the second base is silicon, glass, quartz, ceramic, or PCB. The structure of the second base is lead-frame. The material of the elastic material is silicon resin, elastic PU, porous PU, acrylic rubber or die sawing tape (Blue tape/UV tape). The elastic material is formed on the surface of the first base by spin coating, printing or adhering. The adhesive material is formed on the surface of the second base by spin coating or printing. Wherein the plurality of dice are fixed on the elastic material its with bottom surface exposed, and the dice back adhered to the adhesive material. The second condition comprises DI water, solvent, or UV light.

DETAILED DESCRIPTION

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

Figure 1:
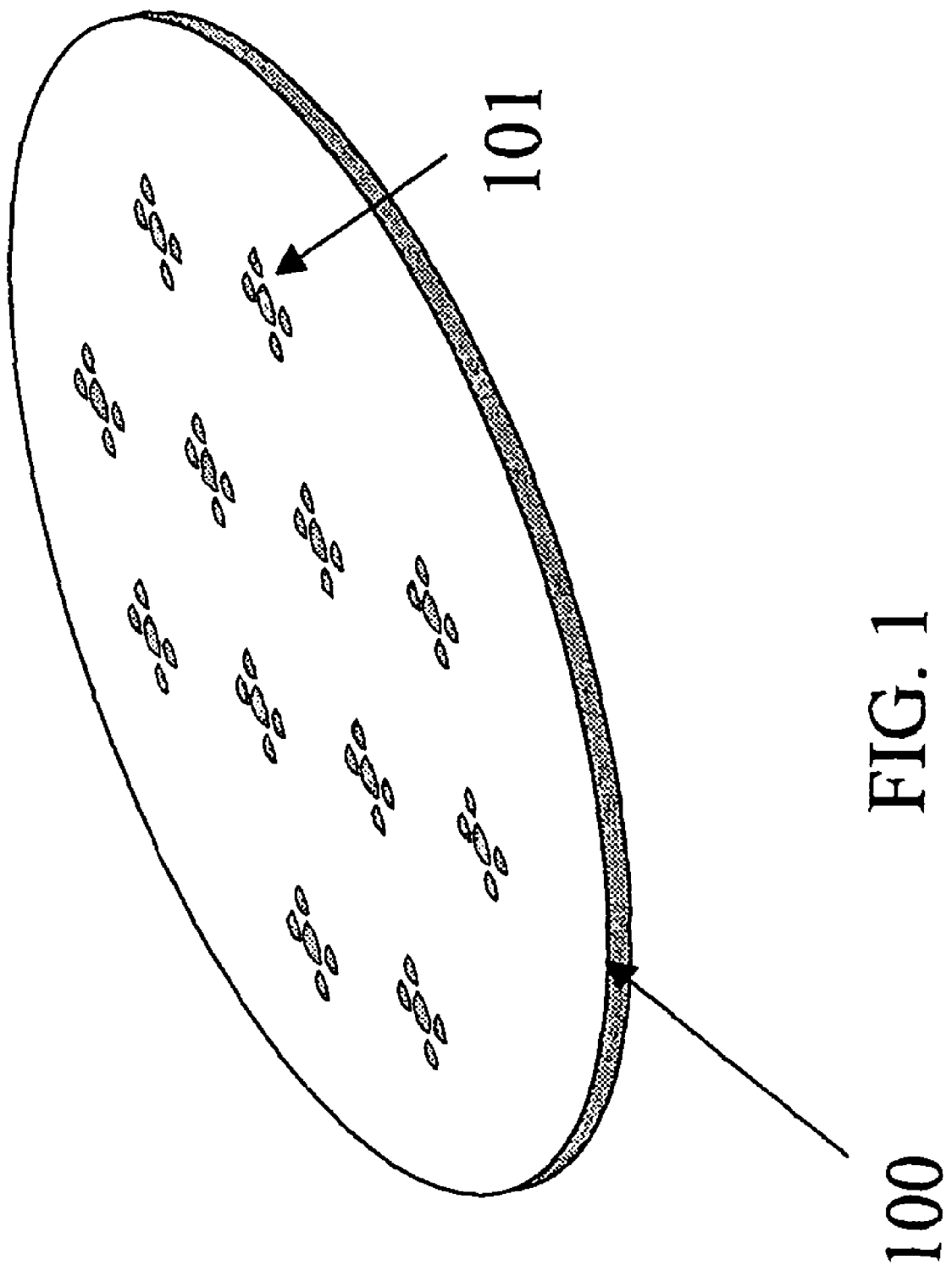
FIG. 1 is a schematic diagram of coating an adhesive material on a second base of the present invention.

Referring to FIG. 1, it is a schematic diagram of coating an adhesive material on a second base of the present invention. As shown in FIG. 1, an adhesive material 101 is coated on a base 100. In one embodiment, the adhesive material 101 is formed on surface of the base 100 by spin coating or printing. The material of the base 100 is silicon, glass, quartz, ceramic, PCB etc. or the base 100 could be a lead-frame.

Figure 2:
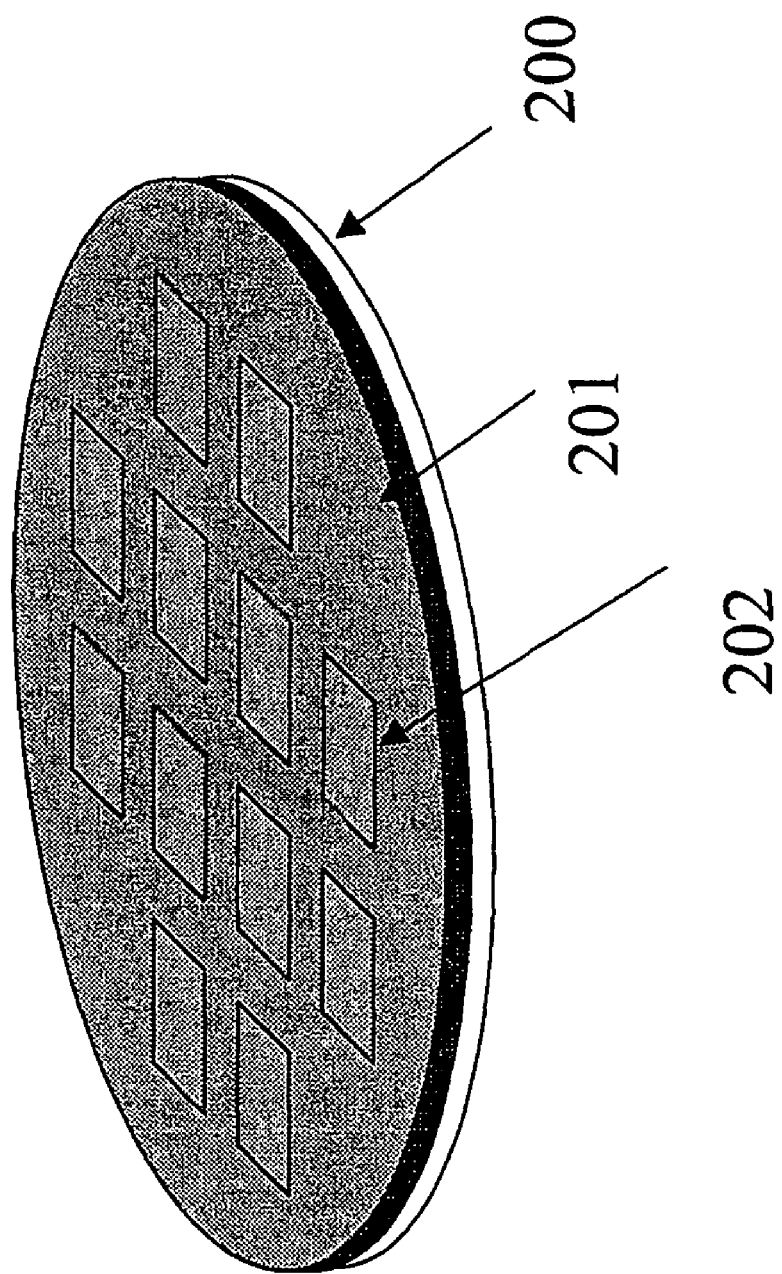
FIG. 2 is a schematic diagram of adhering a plurality of dies on an elastic material of the present invention.

Referring to FIG. 2, it is a schematic diagram of adhering a plurality of dice on an elastic material of the present invention. As shown in FIG. 2, pluralities of dice 202 are placed on an elastic material 201. The elastic material 201 is formed on a base 200. The elastic material 201 has viscosity in common state or at atmosphere environment. In one embodiment, material of the elastic material 201 is silicon resin, elastic PU, porous PU, acrylic rubber or die sawing tape (Blue tape/UV tape) etc. Moreover, material of the base 200 is silicon, glass, quartz or ceramic etc. The elastic material 201 may be formed on surface of the base 200 by spin coating, printing or adhering. As noted, positive side (Al pads side) of the die is placed on the adhesive material 201.

Figure 3:
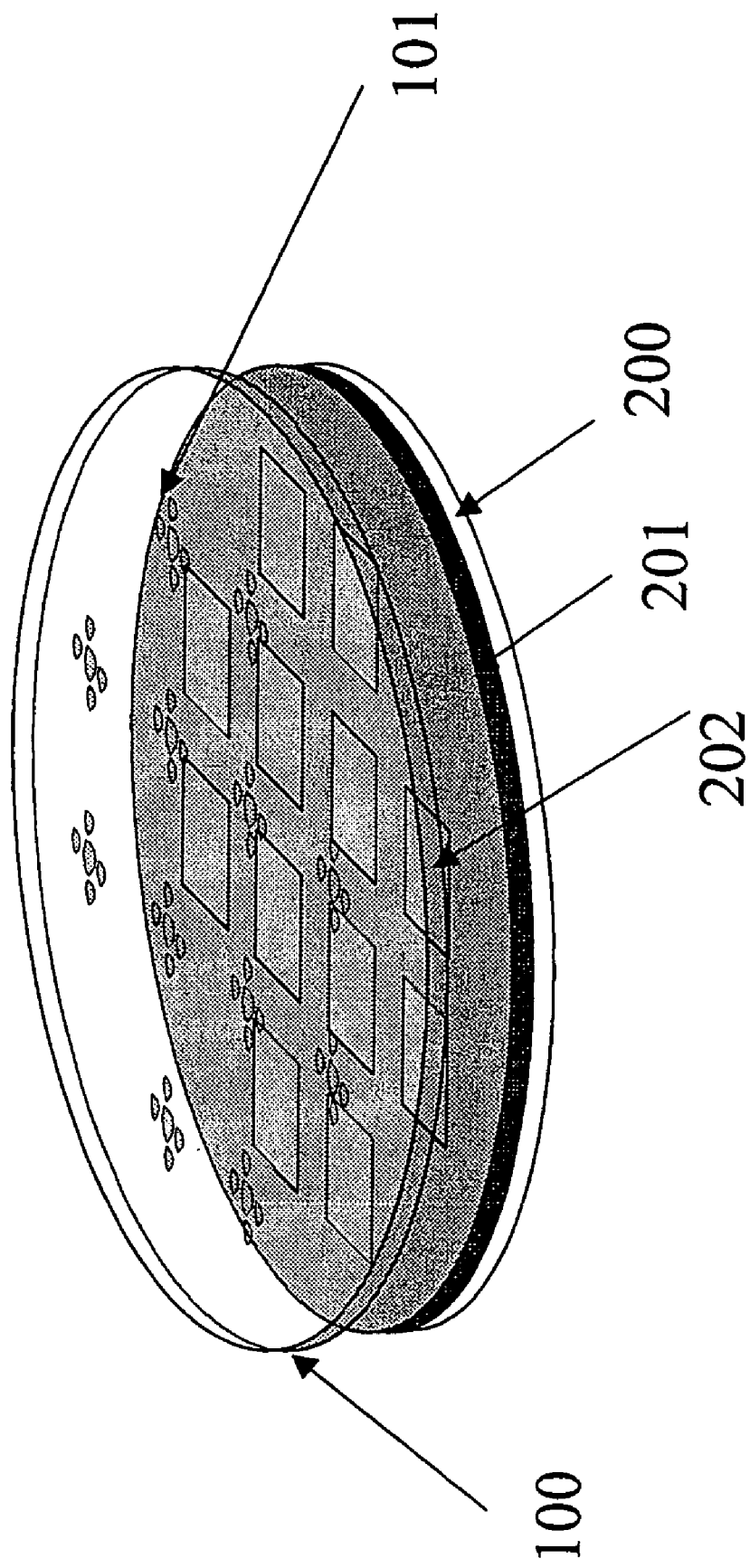
FIG. 3 is a schematic diagram of adhering a plurality of dies on a second base of the present invention.

Referring to FIG. 3, it is a schematic diagram of adhering a plurality of dice on the base 100 of the present invention. As shown in FIG. 3, the base 100 can be reversed to face the dies 202 with adhesive material side. The dice 202 are adhered to the base 100 by the adhesive material 101. A step of UV curing or heat curing is performed after adhering to enhance adhering effect. The plurality of dice 202 are fixed on the elastic material 201 with its bottom surface exposed, and the dice are adhered to the adhesive material 101 on the back side surface. That is to say, the base 100 can be reversed to adhere the plurality of dice's 202 back.

Figure 4:
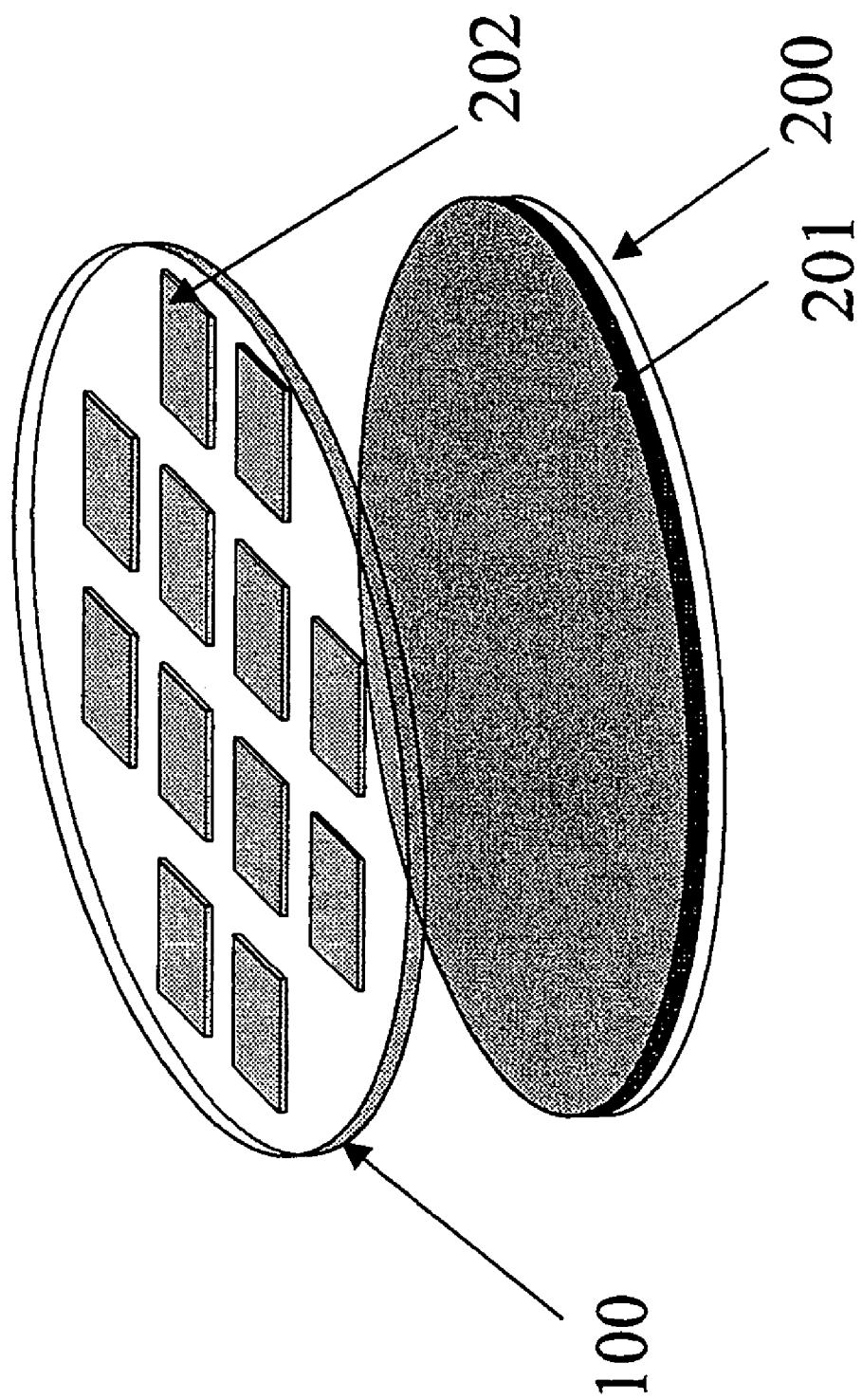
FIG. 4 is a schematic diagram of stripping a plurality of dies from an elastic material of the present invention.
Figure 5:
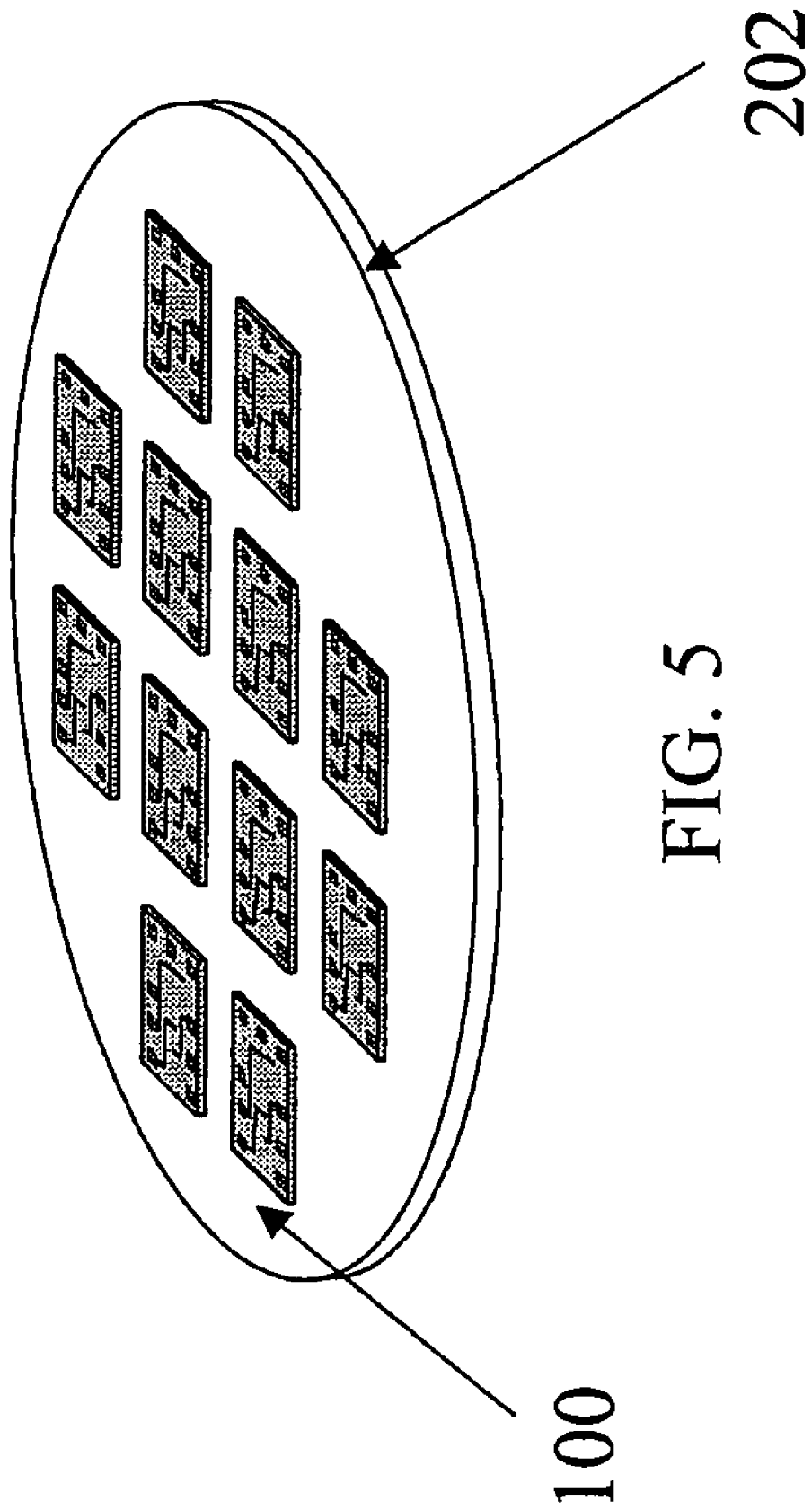
FIG. 5 is a top view of adhering a plurality of dies on a second base of the present invention.

Referring to FIG. 4, it is a schematic diagram of stripping a plurality of dies from an elastic material of the present invention. As shown in FIG. 4, the pluralities of dice 202 are stripped from the elastic material 201 by a special or predetermined environment. That is to say, surface of the elastic material 201 has viscosity in common state, and it lose viscosity when the elastic material 201 is placed in a special environment to. The special or predetermined environment may be the solution of Dl water, special solvent, predetermined temperature around 20-40 centigrade degree depending on the solution, or specific light (such as UV light) etc. The engagement of the elastic material 201 and the base 200 can be reused through cleaning. Subsequently, other batch dice 202 can be adhered to the base 100 again by the adhesive material 101, thereby repeating the similar process as aforementioned, as shown in FIG. 5. Therefore, the design of the present invention can be reuse and recycle.

Figure 6:
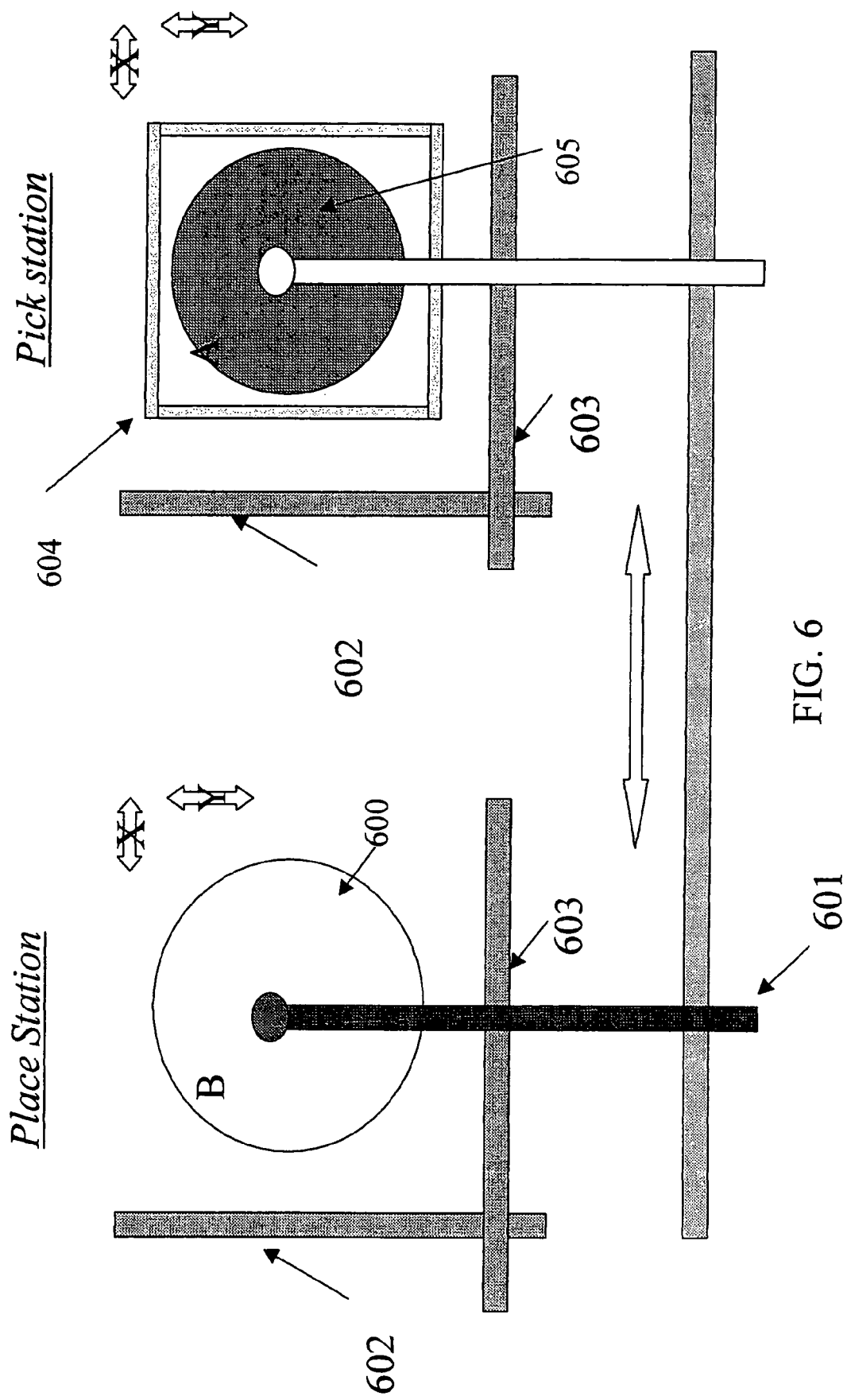
FIG. 6 is a schematic diagram of mechanical structure of pick and place of the present invention.

Referring to FIG. 6, it is a schematic diagram of mechanical structure of pick and place according to the present invention. As shown in FIG. 6, the plurality of dice 202 are placed on the elastic material 201 by using a pick and place system. The pick and place system can be regarded as a movable flip chip bonder. A processed wafer 605 is placed on a frame 604 of a pick station. The processed wafer 605 has dice 202, and the dice 202 are placed on a tool 600 of a place station by a pick and place arm 601. The pick station and the place station are in the same carrier stage. The tool 600 is consisted of the elastic material 201 and the base 200. The pick and place arm 601 can move toward up and down directions by a Y direction step motor 603. Besides, pick and place arm 601 can also move in horizontal direction by an X direction step motor 602. That is to say, the pick and place arm 601 can precisely place the plurality of dice 202 on the tool 600 by the Y-step motor 603 and X-step motor 602.

Figure 7:
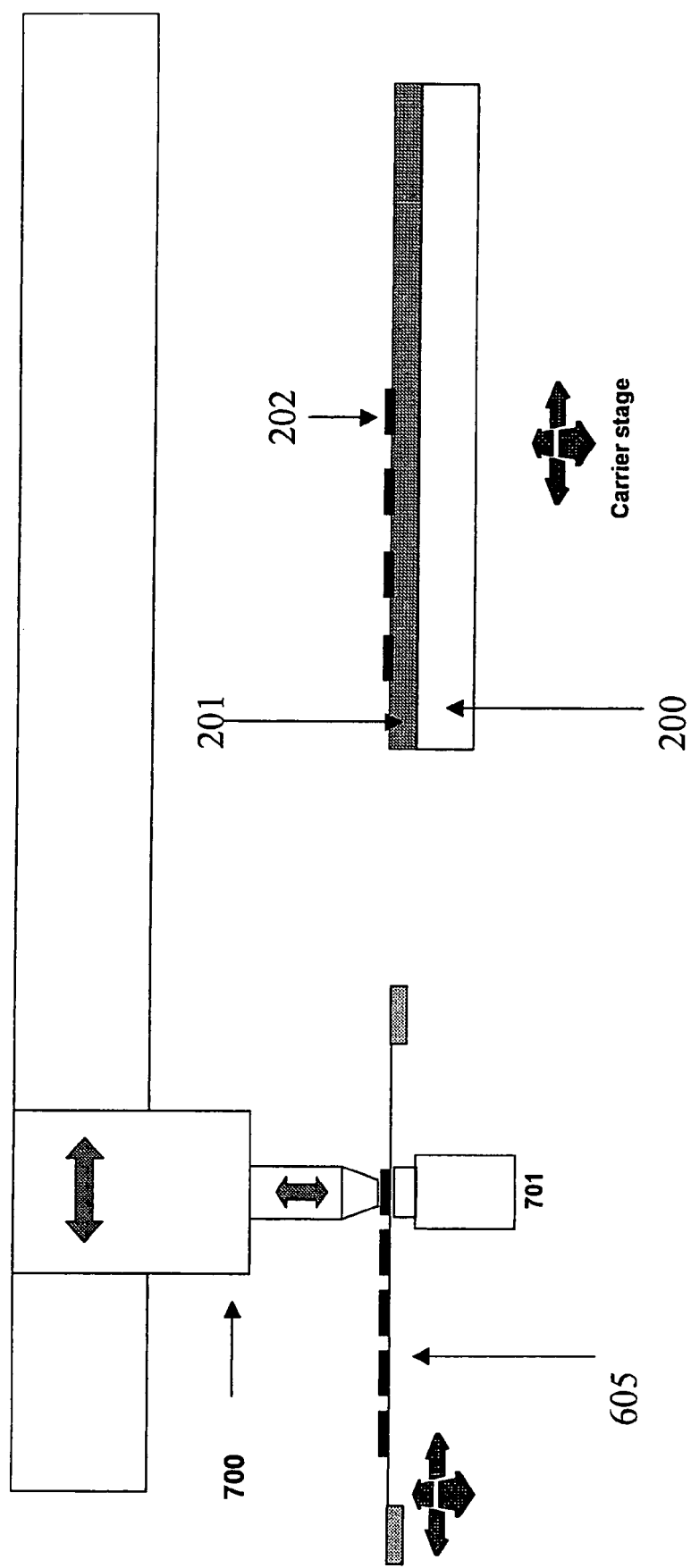
FIG. 7 is a schematic diagram of adhering a plurality of dies on an elastic material on pick and place system of the present invention.

Referring to FIG. 7, it is a schematic diagram of adhering a plurality of dice on an elastic material on picks and place system of the present invention. The plurality of dies 202 of the sawed wafer 605 may be slightly pressed and attached by using an attaching head 701 of the pick and place arm 601 to make the dies 202 flipping away from the processed wafer 605 through a die ejecting module 701 under the processed wafer 605. And then, the plurality of dies 202 can be precisely placed on the elastic material 201 by the Y-step motor 603 and X-step motor 602. The pick and place system has a fine alignment function so that its accuracy can reach less 5 micro.

The plurality of dice of the present invention can be simultaneously adhered to the base. It is a different method from conventional method which is adhere the die one by one on the base. Therefore, the sawed dies can be simultaneously placed by using tool of the present invention to improve die placing efficiency of wafer level package. The tool design according to the present invention can be reuse and recycle.

Although specific embodiments have been illustrated and described, it will be obvious to those skilled in the art that various modifications may be made without departing from what is intended to be limited solely by the appended claims.

What is claimed is:

1. A placing method of die for wafer level package, comprising:
   placing a plurality of dice on an elastic material by using a pick and place system, said elastic material formed on a first base, said elastic material having a viscosity in a first condition to adhere said plurality of dice;
   forming an adhesive material on a second base;
   adhering said plurality of dice on said adhesive material of said second base;
   reducing the viscosity of the elastic material so that the elastic material is in a second condition; and
   stripping said plurality of dice adhered by said viscosity from said elastic material in solvent or UV light condition whereby substantially eliminating said viscosity of said elastic material without dissolving said elastic material.

2. The method in claim 1, wherein the material of said first base is silicon, glass, quartz or ceramic.

3. The method in claim 1, wherein the material of said second base is silicon, glass, quartz, ceramic or PCB.

4. The method in claim 1, wherein said second base is lead frame.

5. The method in claim 1, wherein material of said elastic material is silicon resin, elastic PU, porous PU, acrylic rubber or die sawing tape (Blue tape/UV tape).

6. The method in claim 1, wherein said elastic material is formed on a surface of said first base by spin coating, printing or adhering.

7. The method in claim 1, wherein said adhesive material is formed on a surface of said second base by spin coating or printing.

8. The method in claim 1, wherein said plurality of dice are fixed on said elastic material with a bottom surface exposed.

9. The method in claim 1, further comprising a step of UV curing or heat curing after adhering.

* * * * *